(12) United States Patent
Kusuda

(10) Patent No.: US 12,055,615 B2
(45) Date of Patent: Aug. 6, 2024

(54) DETECTION VALUE CORRECTION SYSTEM, COEFFICIENT CALCULATION METHOD, AND DETECTION VALUE CORRECTION METHOD

(71) Applicant: NIDEC READ CORPORATION, Kyoto (JP)

(72) Inventor: Tatsufumi Kusuda, Kyoto (JP)

(73) Assignee: NIDEC READ CORPORATION, Kyoto (JP)

( * ) Notice: Subject to any disclaimer, the term of this patent is extended or adjusted under 35 U.S.C. 154(b) by 143 days.

(21) Appl. No.: 17/438,471

(22) PCT Filed: Mar. 5, 2020

(86) PCT No.: PCT/JP2020/009342
§ 371 (c)(1),
(2) Date: Sep. 13, 2021

(87) PCT Pub. No.: WO2020/184361
PCT Pub. Date: Sep. 17, 2020

(65) Prior Publication Data
US 2022/0155399 A1 May 19, 2022

(30) Foreign Application Priority Data

Mar. 13, 2019 (JP) .................................. 2019-045780

(51) Int. Cl.
*G01R 35/00* (2006.01)
*G01F 25/10* (2022.01)
(Continued)

(52) U.S. Cl.
CPC ............. *G01R 35/00* (2013.01); *G01F 25/10* (2022.01); *G01R 33/063* (2013.01); *G01T 1/2018* (2013.01)

(58) Field of Classification Search
CPC .. G01R 35/00; G01R 33/063; G01R 33/0094; G01R 33/0035; G01F 25/10;
(Continued)

(56) References Cited

U.S. PATENT DOCUMENTS 9,307,949 B2   4/2016  Tsubota et al.
10,459,012 B2  10/2019  Yogeeswaran et al.
(Continued)

FOREIGN PATENT DOCUMENTS

JP   856120916 A    9/1981
JP   H07103997 A  * 4/1995
(Continued)

*Primary Examiner* — Catherine T. Rastovski
*Assistant Examiner* — Yossef Korang-Beheshti
(74) *Attorney, Agent, or Firm* — Viering, Jentschura & Partner mbB

(57) ABSTRACT

A detection value correction system is a detection value correction system that corrects detection values of a plurality of sensors that are arranged in a line and detect a physical quantity, and includes a correction processing unit that corrects a detection value of a target sensor, which is a sensor to be corrected, among the sensors based on at least detection values of sensors adjacent to the target sensor.

14 Claims, 8 Drawing Sheets

(51) Int. Cl.
*G01R 33/06* (2006.01)
*G01T 1/20* (2006.01)

(58) Field of Classification Search
CPC . G01F 15/024; G01T 1/2018; G01T 1/20184; G01N 23/04; G01N 27/72
See application file for complete search history.

(56) References Cited

U.S. PATENT DOCUMENTS

| | | |
|---|---|---|
| 10,989,741 B2 | 4/2021 | Shimizu et al. |
| 2016/0011239 A1* | 1/2016 | Yoon .................. G01R 15/20 324/126 |
| 2018/0106734 A1* | 4/2018 | Lang .................. G01N 23/046 |

FOREIGN PATENT DOCUMENTS

| | | |
|---|---|---|
| JP | 2002169614 A | 6/2002 |
| JP | 2007085835 A | 4/2007 |
| JP | 2010190775 A | 9/2010 |
| JP | 2013079825 A | 5/2013 |
| JP | 2016142568 A | 8/2016 |

* cited by examiner

DETECTION VALUE CORRECTION SYSTEM, COEFFICIENT CALCULATION METHOD, AND DETECTION VALUE CORRECTION METHOD

CROSS-REFERENCE TO RELATED APPLICATIONS

This application is a U.S. national stage application, filed under 35 U.S.C. § 371, of International Patent Application No. PCT/JP2020/009342, filed on Mar. 5, 2020, and claims priority under 35 U.S.C. § 119(a) and 35 U.S.C. § 365(b) from Japanese Patent Application No. 2019-045780, filed on Mar. 13, 2019; the disclosures of which are incorporated herein by reference.

FIELD

Various embodiments relate to a detection value correction system and a detection value correction method for correcting a detection value of a sensor, and a coefficient calculation method for calculating a coefficient used for correction of a detection value.

BACKGROUND

Conventionally, a magneto impedance (MI) sensor including an amorphous wire and a coil wound around the amorphous wire is known. It is known to detect a magnetic distribution by a magnetic sensor array in which MI sensors are aligned in a line.

When the distribution of magnetism is detected by the MI sensor described above, the resolution of the distribution position is determined by the adjacent pitch of the MI sensor. Therefore, it is considered necessary to reduce the adjacent pitch of the MI sensor in order to improve the resolution of the distribution position. However, if the adjacent pitch of the MI sensor is reduced, the following problem may occur due to the operation principle of the MI sensor.

When the pulse current flows through the amorphous wire of the MI sensor, the orientation of the spin in the amorphous wire is aligned in the direction orthogonal to the amorphous wire by the magnetic field generated by the current. In this state, when the current becomes zero and the magnetic field due to the current disappears, the orientation of each spin is in a direction corresponding to the external magnetic field. Thus, when the spin changes from the direction orthogonal to the amorphous wire to the direction corresponding to the external magnetic field, a magnetic flux having an intensity corresponding to the external magnetic field is generated. An electromotive force is generated in the coil according to the change in the magnetic flux. Therefore, the MI sensor detects the external magnetic field by generating an electromotive force corresponding to the external magnetic field in the coil.

However, the magnetic flux accompanying the direction change of the spin spreads to the surrounding to some extent. Therefore, when the adjacent pitch of the MI sensor is small, the magnetic flux generated according to the direction change of the spin of a certain MI sensor reaches the surrounding MI sensor, and is detected by the MI sensor. As a result, detection accuracy of the magnetic field in the adjacent MI sensors may decrease.

Similarly to the MI sensor, also in a sensor other than the MI sensor, when a plurality of arranged sensors each affect a detection value of other surrounding sensors, there is a concern that detection accuracy of the sensor deteriorates if the adjacent pitch of the sensors is reduced.

SUMMARY

A detection value correction system according to one example of the present disclosure is a detection value correction system that corrects a detection value of a plurality of sensors that are arranged in a line and detect a physical quantity, and the detection value correction system includes a correction processing unit that executes correction processing of correcting a detection value of a target sensor, which is a sensor to be corrected, among the plurality of sensors, based on at least a detection value of a first sensor adjacent to the target sensor.

A detection value correction method according to one example of the present disclosure is a detection value correction method for correcting a detection value of a plurality of sensors that are arranged in a line and detect a physical quantity, the detection value correction method including: executing correction processing of correcting a detection value of a target sensor, which is a sensor to be corrected, among the plurality of sensors, based on at least a detection value of a first sensor adjacent to the target sensor.

A coefficient calculation method according to one example of the present disclosure is a coefficient calculation method for calculating, for one of a plurality of sensors that are arranged in a line and detect a physical quantity, a first coefficient $k_1$ representing an influence of a first sensor adjacent to the sensor on the sensor and a second coefficient $k_2$ representing an influence of a second sensor adjacent to the first sensor in a direction opposite to the first sensor on the first sensor, the coefficient calculation method including: (a) a step of acquiring a detection value of each of the plurality of sensors arranged in the line in a state where the physical quantity is non-uniformly applied to the sensors; (b) a step of applying temporary different values to one another to a plurality of the first coefficients $k_1$, and corresponding to each of the first coefficients $k_1$ applied with the temporary value, (b1) calculating a value $D_X$ based on a following Expression (2) for a case where X is 3 to (Q−2), where the plurality of sensors are given serial numbers as sensors 1 to Q, a detection value of a sensor X, which is an arbitrary X-th sensor, of the sensors 1 to Q is $B_X$, a detection value of a sensor (X+1) of an (X+1)-th adjacent to one side of the sensor X, is $B_{X+1}$, a detection value of a sensor (X−1) of an (X−1)-th adjacent to another side of the sensor X, is $B_{X-1}$, a detection value of a sensor (X+2) of an (X+2)-th adjacent to the sensor (X+1) in a direction opposite to the sensor X is $B_{X+2}$, a detection value of a sensor (X−2) of an (X−2)-th adjacent to the sensor (X−1) in a direction opposite to the sensor X is $B_{X-2}$, and the second coefficient is $k_2$, (b2) searching for a value D(n) and a value D(n−1) at which a square of a difference between a value D(n) and a value D(n−1) of a sensor n and a sensor (n−1) adjacent to each other becomes maximum for n that is an integer of 4 to (Q−2) among values D(3) to D(Q−2) calculated in the step (b1), and calculating the maximum square of the difference between the value D(n) and the value D(n−1) as MAX[$\{D(n)-D(n-1)\}^2$], (b3) searching for a value D(m) and a value D(m−1) at which a square of a difference between a value D(m) and a value D(m−1) of a sensor m and a sensor (m−1) adjacent to each other becomes minimum for m that is an integer of 4 to (Q−2) among values D(3) to D(Q−2) calculated in the step (b1), and calculating the minimum square of the difference between the value D(m) and the value D(m−1) as MIN[{D(m)−D(m−1)}$^2$], and (b4) calculating a plurality of evaluation values U(k$_1$) corresponding to values of a plurality of the coefficients k$_1$ based on a following expression (3); and (c) a step of searching for a maximum evaluation value U(k$_1$) among the plurality of evaluation values U(k$_1$), and setting a first coefficient k$_1$ corresponding to the maximum evaluation value U(k$_1$) and a second coefficient k$_2$ obtained from the first coefficient k$_1$ as the first coefficient and the second coefficient used for the correction processing.

$$D(X)=k_2B_{X-2}-k_1B_{X-1}+B_X-k_1B_{X+1}+k_2B_{X+2} \quad (2)$$

$$U(k_1)=\text{MAX}[\{D(n)-D(n-1)\}^2]-\text{MIN}[\{D(m)-D(m-1)\}^2] \quad (3)$$

The above and other elements, features, steps, characteristics and advantages of the present disclosure will become more apparent from the following detailed description of the preferred embodiments with reference to the attached drawings.

BRIEF DESCRIPTION OF THE DRAWINGS

In the drawings, like reference characters generally refer to the same parts throughout the different views. In the drawings, components given the same reference numerals denote the same components, and description thereof will be omitted. The drawings are not necessarily to scale, emphasis instead generally being placed upon illustrating the principles of the disclosed embodiments. In the following description, various embodiments described with reference to the following drawings, in which.

DETAILED DESCRIPTION

Figure 1:
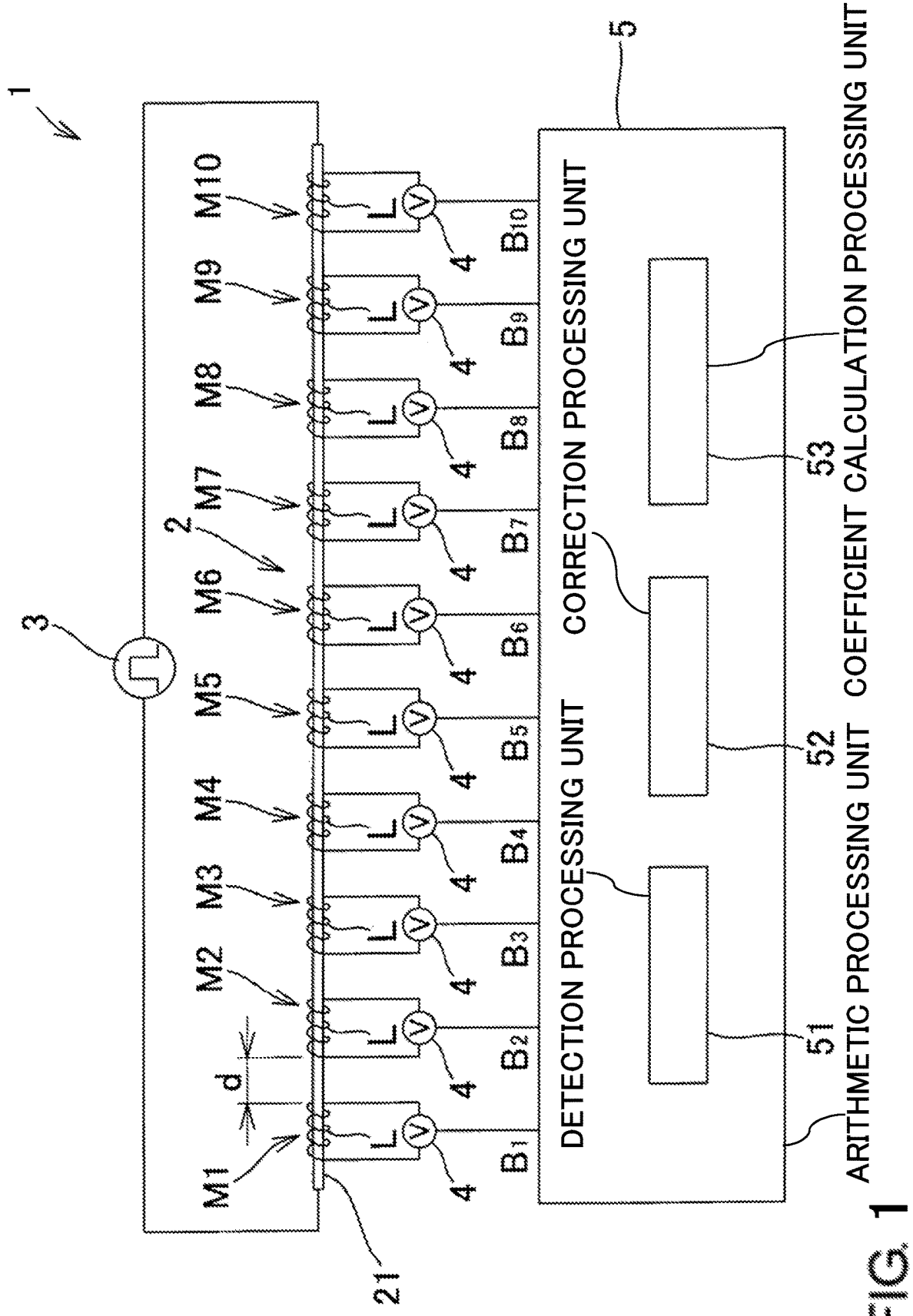
FIG. 1 is an explanatory diagram conceptually showing an example of the configuration of a magnetic measurement device using the detection value correction method according to one embodiment of the present disclosure.

A magnetic measurement device 1 shown in FIG. 1 corresponds to an example of the detection value correction system according to the present disclosure.

The magnetic measurement device 1 shown in FIG. 1 includes a magnetic sensor array 2, a power source 3, a plurality of voltage measurement units 4, and an arithmetic processing unit 5. The magnetic sensor array 2 includes an amorphous wire 21 and a plurality of sensors M1 to M10 (sensors) to which sensor numbers 1 to 10 are given. Hereinafter, the sensors M1 to M10 are collectively referred to as a sensor M. The sensor M is a so-called magnetic impedance sensor (MI sensor), which detects the intensity of a magnetic field.

The amorphous wire 21 is a linear magnetic conductor such as CoFeSiB. The amorphous wire 21 has a diameter of, for example, equal to or less than 100 μm. An insulator layer made of an acrylic resin, for example, is formed on the outer periphery of the amorphous wire 21. Instead of the amorphous wire 21, it is also possible to adopt a wire in which a magnetic anisotropic thin film is coated on a linear body or a wire such as permalloy, which is a Ni—Fe alloy.

A plurality of coils L are wound around the amorphous wire 21 in a line at preset intervals d. The amorphous wire 21 and one coil L wound around the outer periphery of the amorphous wire 21 constitute one sensor M. FIG. 1 shows an example in which ten coils L are wound around one amorphous wire 21 to form ten sensors M1 to M10. Note that the number of sensors M may be less than ten or may be more than ten.

The power source 3 is connected to both ends of the amorphous wire 21. The power source 3 outputs a pulsed current having a preset current value to the amorphous wire 21 according to a control signal from the arithmetic processing unit 5.

Note that the present disclosure is not necessarily limited to the example in which the plurality of coils L are wound around one amorphous wire 21 to form the plurality of sensors M. The amorphous wire 21 may be separated for each sensor M. Then, current may be supplied from the power source to each separated amorphous wire 21. However, by winding the plurality of coils L around one amorphous wire 21, the current flowing through each sensor M becomes equal. As a result, the variation in detection value of each sensor M is reduced, and therefore a configuration in which the plurality of coils L are wound around one amorphous wire 21 is more preferable.

The voltage measurement unit 4 includes, for example, an amplifier, a peak hold circuit, and an analog-digital converter. Each voltage measurement unit 4 measures the voltage induced in each coil L in the sensors M1 to M10, and transmits a signal indicating the measurement result to the arithmetic processing unit 5 as detection values B$_1$ to B$_{10}$ of the sensors M1 to M10.

The arithmetic processing unit 5 includes, for example, a central processing unit (CPU) that executes predetermined arithmetic processing, a random access memory (RAM) that temporarily stores data, a storage unit such as a hard disk drive (HDD) and/or a flash memory that stores a predetermined control program and the like, and peripheral circuits thereof. By executing a predetermined control program or the like, the arithmetic processing unit 5 functions as a detection processing unit 51, a correction processing unit 52, and a coefficient calculation processing unit 53.

The detection processing unit 51 acquires the output of each voltage measurement unit 4 as the detection values B$_1$ to B$_{10}$ of the sensors M1 to M10.

The correction processing unit 52 executes correction processing of correcting a detection value B$_n$ of a target sensor Mn, which is a sensor to be corrected, among the sensors M1 to M10, at least based on the detection value of the first sensor adjacent to the target sensor Mn. By executing correction processing with the sensors M1 to M10 as the target sensor Mn sequentially, the correction processing unit 52 corrects the detection values $B_1$ to $B_{10}$ of the sensors M1 to M10. The correction processing unit 52 corrects the detection values $B_1$ to $B_{10}$ to generate correction values $C_1$ to $C_{10}$.

The coefficient calculation processing unit 53 calculates the coefficients $k_1$ and $k_2$ to be described later based on the experimentally detected detection values $B_1$ to $B_{10}$.

Note that the detection value correction system is not necessarily limited to an example in which the plurality of sensors, the correction processing unit 52, and the coefficient calculation processing unit 53 are configured as a single device. For example, the magnetic measurement device may not include the correction processing unit 52 and the coefficient calculation processing unit 53. Then, a correction device including the correction processing unit 52 and the coefficient calculation processing unit 53 may be configured by a computer such as a personal computer, for example, separate from the magnetic measurement device. The detection values $B_1$ to $B_{10}$ detected by the magnetic measurement device may be configured to be corrected by the correction device. In this case, the detection value correction system is configured by the magnetic measurement device and the correction device.

The detection value correction system is not necessarily required to include a plurality of sensors. The detection value correction system may be a correction device including the correction processing unit 52 and the coefficient calculation processing unit 53. Furthermore, the detection value correction system may include a correction processing device including the correction processing unit 52 and a coefficient calculation processing device including the coefficient calculation processing unit 53.

The magnetic measurement device 1 may be configured as an inspection device further including an inspection unit that inspects a measurement target object based on the correction values $C_1$ to $C_{10}$ generated by the correction processing unit 52. For example, the magnetic measurement device 1 may be an inspection device in which the inspection unit compares, for example, a reference value stored in advance in a storage unit with the correction values $C_1$ to $C_{10}$ to determine the quality of the inspection target object and detect the mixture of a foreign matter having magnetism. More specifically, the magnetic measurement device 1 may be configured as an inspection device that detects a metal foreign matter mixed in a battery by detecting a magnetic field on the battery surface by the magnetic sensor array 2.

Next, the operation of the magnetic measurement device 1 configured as described above will be described. First, the user causes the magnetic sensor array 2 to approach and face a measurement target object of which magnetic field is desired to be measured, or arranges the magnetic sensor array 2 at a place where the magnetic field is desired to be measured. Thereafter, the operation of the magnetic measurement device 1 is started.

Figure 2:
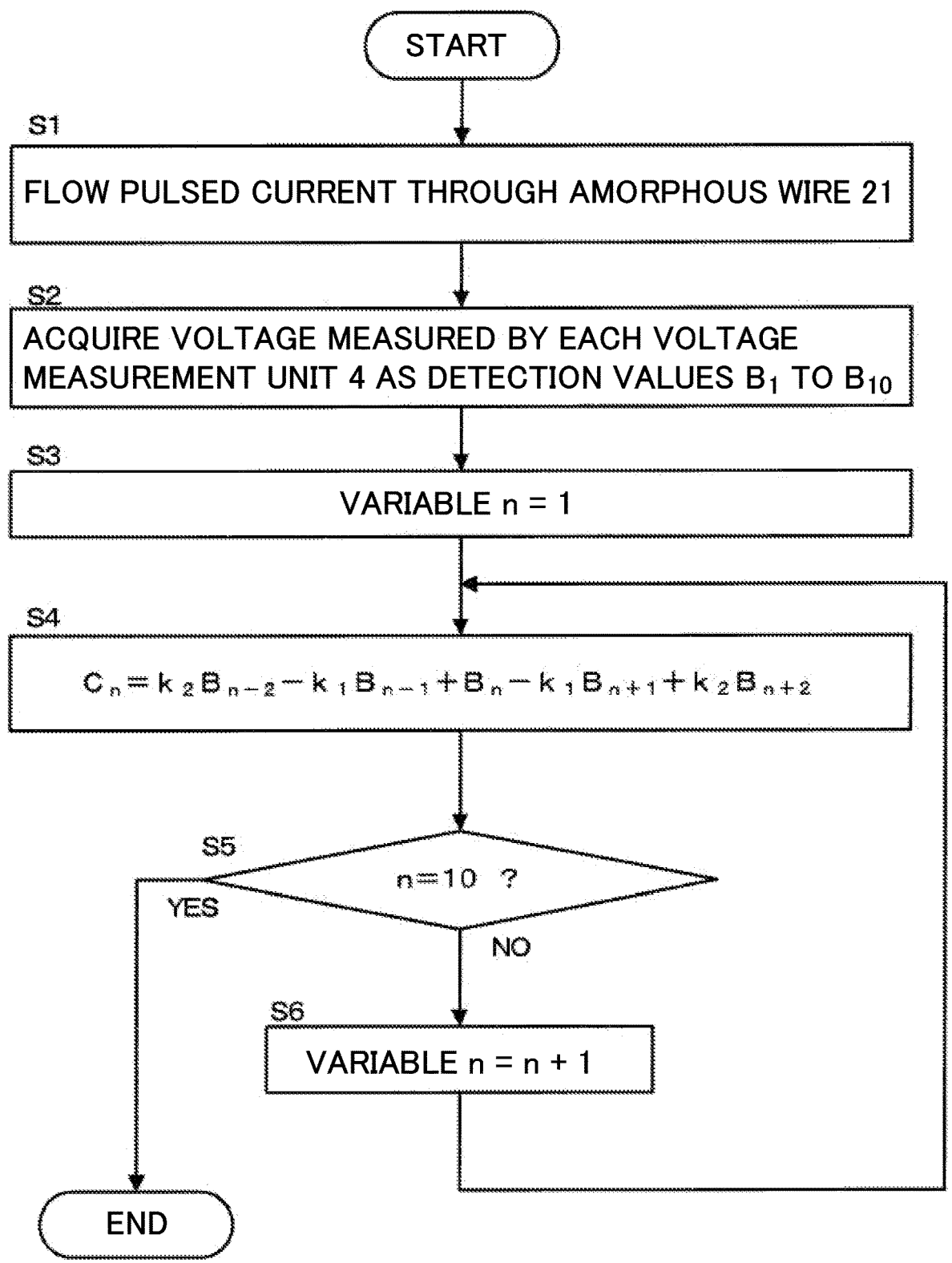
FIG. 2 is a flowchart showing an example of the operation of the magnetic measurement device shown in FIG. 1.

Referring to FIG. 2, first, by the power source 3, the detection processing unit 51 causes a pulsed current having a preset current value to flow through the amorphous wire 21 (step S1).

The magnetic flux due to the current is generated concentrically around the amorphous wire 21. Since the coil L is wound around the outer periphery of the amorphous wire 21, the orientation of the magnetic flux generated by the current and the winding of the coil L are substantially the same. In the coil L, voltage is generated by electromagnetic induction when a magnetic flux intersecting the winding changes. However, since the magnetic flux generated by the current does not intersect the winding of the coil L, voltage is not generated in the coil L for the current flowing through the amorphous wire 21.

On the other hand, when the current flows through the amorphous wire 21, the orientation of the spin in the amorphous wire 21 is aligned in the direction orthogonal to the amorphous wire 21 by the magnetic field generated by the current during the period in which the current flows. Thereafter, when the pulse falls, the current becomes zero, and the magnetic field generated by the current disappears, the orientation of each spin of the amorphous wire 21 faces in a direction corresponding to the external magnetic field. As described above, when the spin changes from the direction orthogonal to the amorphous wire 21 to the direction corresponding to the external magnetic field, a magnetic flux having an intensity corresponding to the external magnetic field is generated. Since the magnetic flux accompanying the direction change of the spin includes a component in the direction intersecting the winding of the coil L, voltage is generated in the coil L according to the change of the magnetic flux accompanying the direction change of the spin.

The voltage thus generated in each coil L represents the intensity of the external magnetic field at each position of the sensors M1 to M10. Each voltage measurement unit 4 measures a peak voltage generated by the coil L of the sensors M1 to M10. Each voltage measurement unit 4 outputs a signal indicating the measured voltage to the arithmetic processing unit 5 as the detection values $B_1$ to $B_{10}$ of the sensors M1 to M10.

The detection processing unit 51 acquires the voltage measured by each voltage measurement unit 4 as the detection values $B_1$ to $B_{10}$ (step S2).

Here, the detection values $B_1$ to $B_{10}$ of the sensors M1 to M10 include an error due to the influence of another sensor M. For example, the coil L of the sensor M5 detects not only the magnetic flux generated by the spin in the amorphous wire 21 at the position of the sensor M5 but also the magnetic flux generated by the spin at the positions of the sensors M4 and M6 adjacent to the sensor M5. The coil L of the sensor M5 may further detect the magnetic flux generated by the spin at the positions of the sensors M3 and M7 adjacent to those sensors M4 and M6. Therefore, the detection values $B_1$ to $B_{10}$ of the sensors M1 to M10 include an error due to the influence of another sensor M.

Therefore, the correction processing unit 52 executes correction processing of correcting the detection values $B_1$ to $B_{10}$ acquired by the detection processing unit 51 so as to reduce an error due to the influence of another sensor M. The following steps S3 to S6 correspond to an example of the correction processing.

First, the correction processing unit 52 initializes a variable n to 1 (step S3).

Next, the correction processing unit 52 calculates a correction value $C_n$ of the detection value $B_n$ of the target sensor Mn based on the following Expression (1) (step S4), where the detection value of the target sensor Mn to be corrected is $B_n$, the detection value of the sensor M(n+1) corresponding to the first sensor adjacent to one side of the target sensor Mn is $B_{n+2}$, the detection value of the sensor M(n−1) corresponding to the first sensor adjacent to the other side of the target sensor Mn is $B_{n-2}$, the detection value of the sensor M(n+2) corresponding to the second sensor adjacent to the sensor M(n+1) in the direction opposite to the target sensor Mn is $B_{n+2}$, and the detection value of the sensor M(n−2) corresponding to the second sensor adjacent to the sensor M(n−1) in the direction opposite to the target sensor Mn is $B_{n-2}$.

$$C_n = k_2 B_{n-2} - k_1 B_{n-1} + B_n - k_1 B_{n+1} + k_2 B_{n+2} \quad (1)$$

The coefficient $k_1$ (first coefficient) and the coefficient $k_2$ (second coefficient) are calculated in advance by, for example, a coefficient calculation method to be described later and stored in the storage unit.

The correction processing unit 52 executes the calculation of Expression (1) with $B_{n-1}=B_{n-2}=0$ when n=1, $B_{n-2}=0$ when n=2, $B_{n+2}=0$ when n=9, and $B_{n+1}=B_{n+2}=0$ when n=10.

According to Expression (1), the detection value of the sensor Mn that is the target sensor can be corrected by adding a value obtained by multiplying the detection value of the first sensor by the first coefficient to the detection value of the target sensor, and subtracting a value obtained by multiplying the detection value of the second sensor by the second coefficient smaller than the first coefficient from the detection value of the target sensor.

Next, the correction processing unit 52 compares 10, which is the number of sensors M, with the variable n (step S5). If the variable n is not 10 (NO in step S5), the correction processing unit 52 adds 1 to the variable n (step S6), and repeats steps S4 and S5 again.

On the other hand, if the variable n is 10 (YES in step S5), the correction values $C_1$ to $C_{10}$ are calculated, and all the detection values are corrected, and hence the correction processing unit 52 ends the correction processing.

Next, the reason why the detection values $B_1$ to $B_{10}$ can be corrected so as to reduce an error due to the influence of another sensor M by the above-described Expression (1) will be described.

The detection value $B_n$ of the sensor Mn is represented by the following Expression (A) where the correct detection value of the sensor Mn, i.e., the detection value when the sensor Mn is not affected by another sensor M is $A_n$, the coefficient representing a quantified degree of the influence on the sensor Mn from the adjacent sensors M(n−1) and M(n+1) is $k_1$, and the coefficient representing a quantified degree of the influence on the sensor Mn from the sensors M(n−2) and M(n+2) further adjacent to the sensors M(n−1) and M(n+1) is $k_2=k_1^2$ in accordance with Expression (4) to be described later.

$$B_n = k_1^2 A_{n-2} - k_1 A_{n-1} + A_n - k_1 A_{n+1} + k_1^2 A_{n+2} \quad (A)$$

Therefore, if the correction value $C_n$ calculated by the above-described Expression (1) is correct, substitution of Expression (A) into Expression (1) should result in the correction value $C_n = A_n$.

Therefore, substitution of Expression (A) into Expression (1) results in as follows. Here, $k_2 = k_1^2$ and $0.5 < k_1 < 1$.

$$C_n = k_1^2 B_{n-2} - k_1 B_{n-1} + B_n - k_1 B_{n+1} + k_1^2 B_{n+2} =$$
$$k_1^2 (k_1^2 A_{n-4} + k_1 A_{n-3} + A_{n-2} + k_1 A_{n-1} + k_1^2 A_n) -$$
$$k_1 (k_1^2 A_{n-3} + k_1 A_{n-2} + A_{n-1} + k_1 A_n + k_1^2 A_{n+1}) +$$
$$k_1^2 A_{n-2} + k_1 A_{n-1} + A_n + k_1 A_{n+1} + k_1^2 A_{n+2} -$$
$$k_1 (k_1^2 A_{n-1} + k_1 A_n + A_{n+1} + k_1 A_{n+2} + k_1^2 A_{n+3}) +$$
$$k_1^2 (k_1^2 A_n + k_1 A_{n+1} + A_{n+2} + k_1 A_{n+3} + k_1^2 A_{n+4})$$

Here, since $0.5 < k_1 < 1$, $k_1^3 \approx k_1^4$ is very small.

Therefore, when approximating $k_1^3 = k_1^4 = 0$, $$C_n = k_1^2 A_{n-2} - k_1^2 (A_{n-2} + A_n) - k_1 A_{n-1} + k_1^2 A_{n-2} + k_1 A_{n-1} +$$
$$A_n + k_1 A_{n+1} + k_1^2 A_{n+2} - k_1^2 (A_n + A_{n+2}) - k_1 A_{n+1} + k_1^2 A_{n+2} =$$
$$k_1^2 (A_{n-2} - 2A_n + A_{n+2}) + k_1 (-A_{n-1} + A_{n-1} + A_{n+1} - A_{n+1}) + A_n$$

here, since $(-A_{n-1} + A_{n-1} + A_{n+1} - A_{n+1})$ is zero, $$C_n = k_1^2 (A_{n-2} - 2A_n + A_{n+2}) + A_n \quad (B)$$

is established.

Furthermore, an object of the detection value correction system and the detection value correction method according to the present disclosure is to solve the problem that the detection accuracy of the sensor may decrease when the adjacent pitch of the sensor is reduced. Therefore, the adjacent pitch of the sensor is sufficiently small with respect to the spatial spread range of the physical quantity of the detection target such as the magnetic field. As a result, the adjacent pitch of the sensors is set such that the difference between the physical quantities of the detection target at the arrangement positions of the sensors Mn and M(n+1) or Mn and M(n−1) adjacent to each other is, for example, 1% or less of $A_n$, which is a physical quantity at the position of the sensor Mn.

Then, $A_{n+2}$ and $A_{n-2}$ are the magnetic field intensities (physical quantities) at the sensor position next but one to the sensor Mn, and thus the difference from the magnetic field intensity (physical quantity) at the position of the sensor Mn is about 1%+1%=2%. Therefore, since it can be approximated as $A_n \approx A_{n-2} \approx A_{n+2}$, it can be approximated as $(A_{n-2} - 2A_n + A_{n+2}) \approx 0$. In addition, since $0.5 < k_1 < 1$, $k_1^2 (A_{n-2} - 2A_n + A_{n+2})$ further approaches zero, and can be approximated as $k_1^2 (A_{n-2} - 2A_n + A_{n+2}) \approx 0$. Therefore, the above Expression (B) can be approximated as $C_n \approx A_n$.

This indicates that the correction value $C_n$ calculated by the above Expression (1) can be approximated to the correct detection value $A_n$ in a case where the sensor Mn is not affected by another sensor M.

Therefore, since the correction value $C_n$ calculated by Expression (1) can be approximated to the correct detection value $A_n$ in a case where the sensor Mn is not affected by another sensor M, all the detection values $B_1$ to $B_{10}$ are corrected by the processing of steps S1 to S6 to obtain the correction values $C_1$ to $C_{10}$. Therefore, it is easy to correct the detection value of each sensor M arranged in a line.

Next, the coefficients $k_1$ and $k_2$ will be described. The coefficients $k_1$ and $k_2$ change depending on a difference in sensitivity due to manufacturing variation or the like of the sensors M, an interval between the sensors M, a distance from the magnetic sensor array 2 to the measurement target object, and the like. Therefore, for example, it is preferable that the coefficients $k_1$ and $k_2$ of the magnetic sensor array 2 are calculated after the magnetic sensor array 2 is manufactured and stored in the storage unit of the arithmetic processing unit 5, or the coefficients $k_1$ and $k_2$ of the magnetic sensor array 2 are calculated after the magnetic sensor array 2 is attached to the magnetic measurement device 1 and stored in the storage unit of the arithmetic processing unit 5.

In the above Expression (1), the coefficients of $B_{n-2}$, $B_{n-1}$, $B_n$, $B_{n+1}$, and $B_{n+2}$ are $k_2$, $-k_1$, 1, $-k_1$, and $k_2$, including signs, and these coefficients function as a sort of filters. Since the degrees of influence of the sensors M on the right and left sides on the target sensor Mn are substantially equal, the coefficients are arranged symmetrically about the detection value $B_n$.

Figure 3:
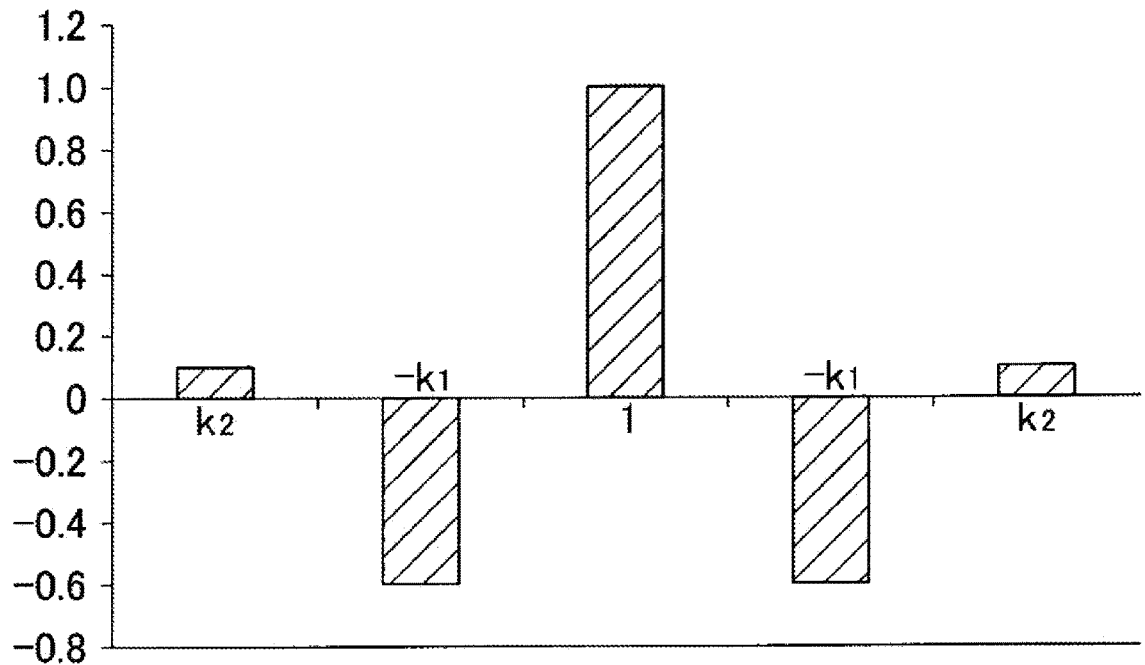
FIG. 3 is an explanatory diagram in which coefficients k$_2$, −k$_1$, 1, −k$_1$, and k$_2$ are graphed.
Figure 4:
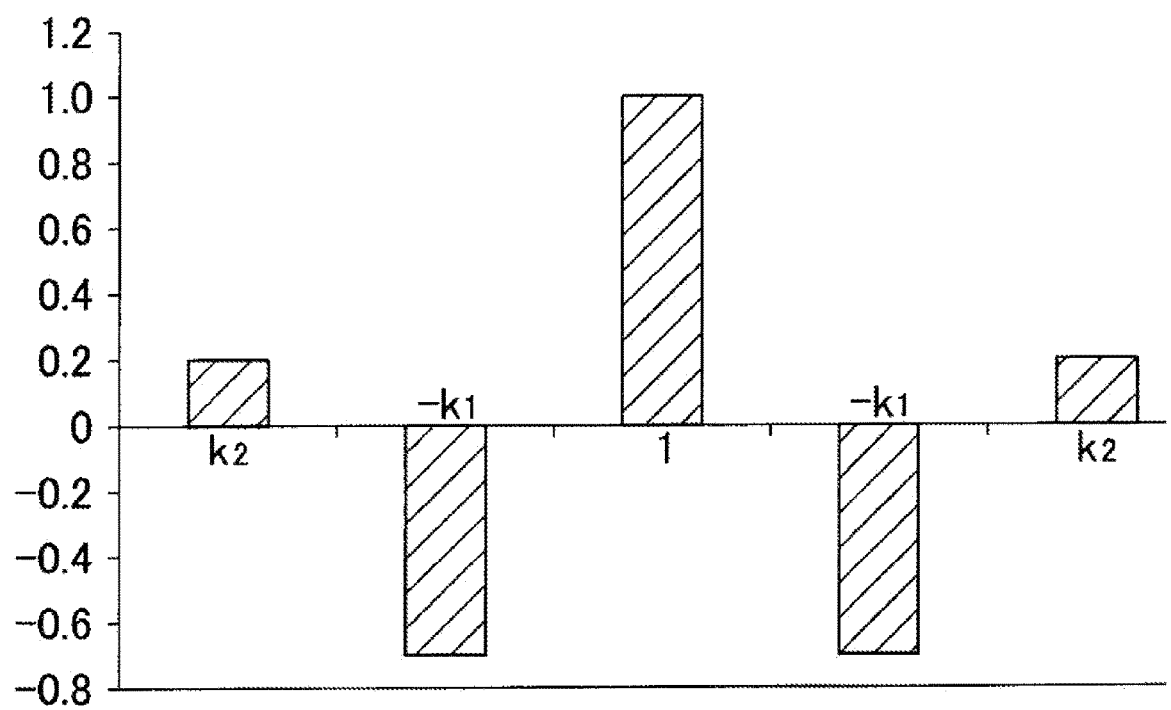
FIG. 4 is an explanatory diagram in which coefficients k$_2$, −k$_1$, 1, −k$_1$, and k$_2$ are graphed.

FIG. 3 shows a case where $k_1=0.6$ and $k_2=0.1$, and FIG. 4 shows a case where $k_1=0.7$ and $k_2=0.2$.

The coefficient $k_1$ numerically indicates the degree of influence of the sensors M(n+1) and M(n−1), which are the first sensors, on the target sensor Mn. The coefficient $k_2$ numerically indicates the degree of influence of the sensors M(n+2) and M(n−2), which are the second sensors, on the target sensor Mn. Since the sensors M(n+2) and M(n−2) are farther away from the target sensor Mn than the sensors M(n+1) and M(n−1), the influence of the sensors M(n+2) and M(n−2) on the target sensor Mn is smaller than the influence of the sensors M(n+1) and M(n−1) on the target sensor Mn. Therefore, the influence represented by the coefficient $k_2$ is smaller than the influence represented by the coefficient $k_1$, and thus $k_1 > k_2$.

The influence is nothing but energy. For example, in a case where a certain sensor M affects another sensor M, energy is transferred from the affecting sensor to the affected sensor.

Therefore, the bars representing the coefficient in FIGS. 3 and 4 can be regarded as representing the exchange of energy with the energy received from the other being positive and the energy given to the other being negative. Even if such energy exchange exists, the total amount of energy does not change, and thus the sum of $k_2$, $-k_1$, 1, $-k_1$, and $k_2$ is substantially zero. That is, the value obtained by subtracting the sum of the coefficients $k_1$ from the value obtained by adding 1 to the sum of the coefficients $k_2$ is substantially zero.

As a result, the sum of the positive values in FIGS. 3 and 4 is equal to the sum of the negative values. Therefore, the following Expression (5) is obtained from the positive coefficients $k_2$, 1, and $k_2$ and the negative coefficients $k_1$ and $k_1$.

$$k_2 + 1 + k_2 = k_1 + k_1 = 2k_1$$

$$2k_2 + 1 = 2k_1$$

$$2k_2 = 2k_1 - 1$$

$$k_2 = k_1 - \tfrac{1}{2} \tag{5}$$

Figure 5:
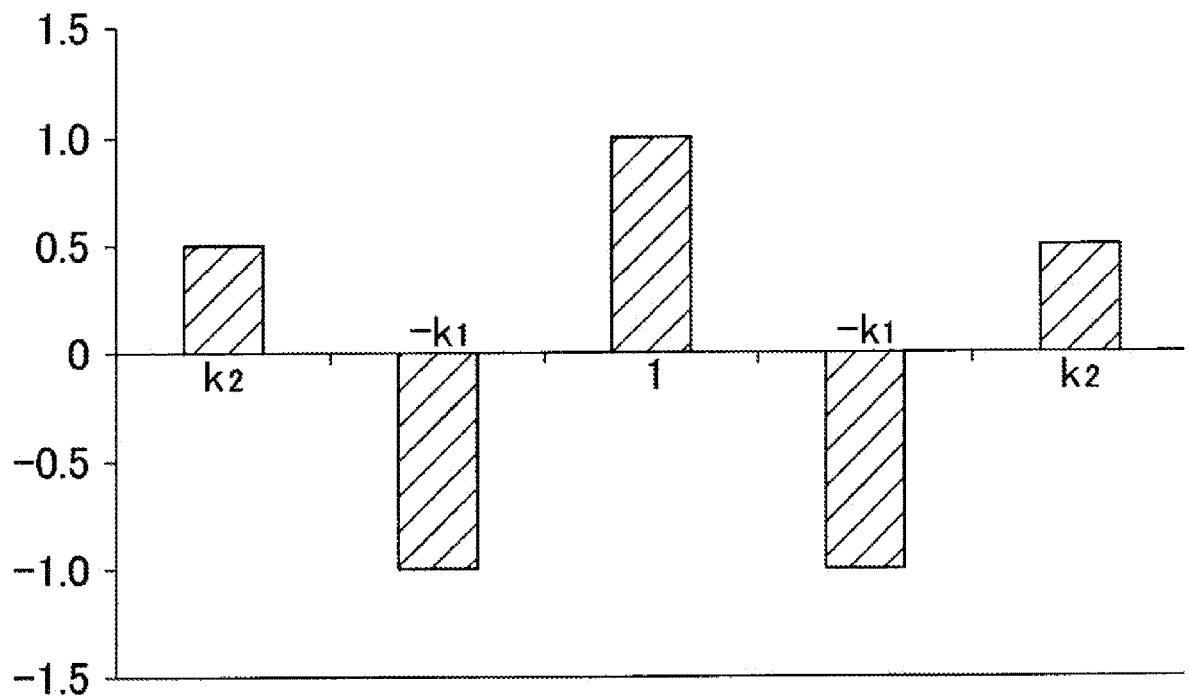
FIG. 5 is an explanatory diagram in which coefficients k$_2$, −k$_1$, 1, −k$_1$, and k$_2$ are graphed.

FIG. 5 shows a case where the coefficient $k_1$ is 1.

When the coefficient $k_1$ exceeds 1, the energy received by the adjacent sensors M on both sides becomes larger than the energy output from the target sensor Mn, and this is inconsistent. Therefore, $k_1 < 1$.

Figure 6:
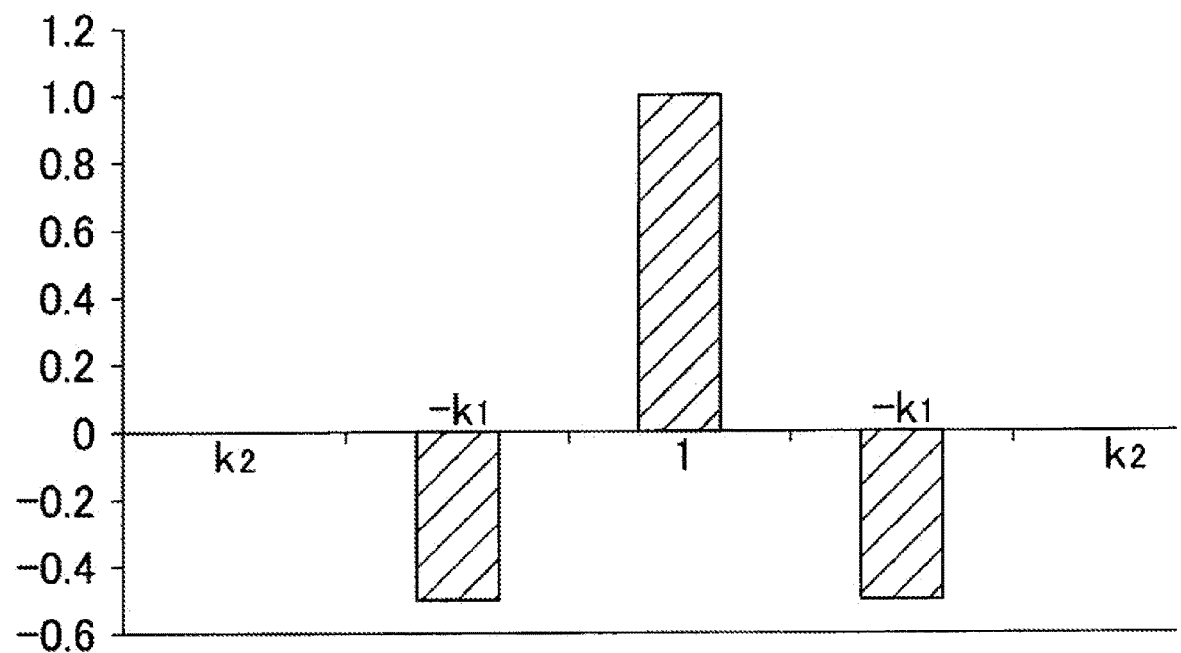
FIG. 6 is an explanatory diagram in which coefficients k$_2$, −k$_1$, 1, −k$_1$, and k$_2$ are graphed.

FIG. 6 shows a case where the coefficient $k_1$ is 0.5. When the coefficient $k_1$ is 0.5, the coefficient $k_2$ becomes 0 from Expression (5), and the coefficient $k_2$ disappears. Therefore, the range of the coefficient $k_1$ is $0.5 < k_1 < 1$.

Note that the relationship between the coefficient $k_1$ and the coefficient $k_2$ is not necessarily limited to the one in the example represented by Expression (5). The relational expression between the coefficient $k_1$ and the coefficient $k_2$ is appropriately set according to the characteristics of the sensor to be used. For example, in the case of a sensor having a characteristic that the influence of a sensor away from the target sensor on the target sensor rapidly decreases as the sensor is away from the target sensor, the relational expression of the following Expression (4) is suitable.

$$k_2 = k_1^2 \tag{4}$$

Furthermore, for example, in the case of a sensor having a characteristic that the influence decreases in inverse proportion to the square of the distance from the target sensor, the relational expression of the following Expression (6) is suitable.

$$k_2 = k_1/4 \tag{6}$$

Figure 7:
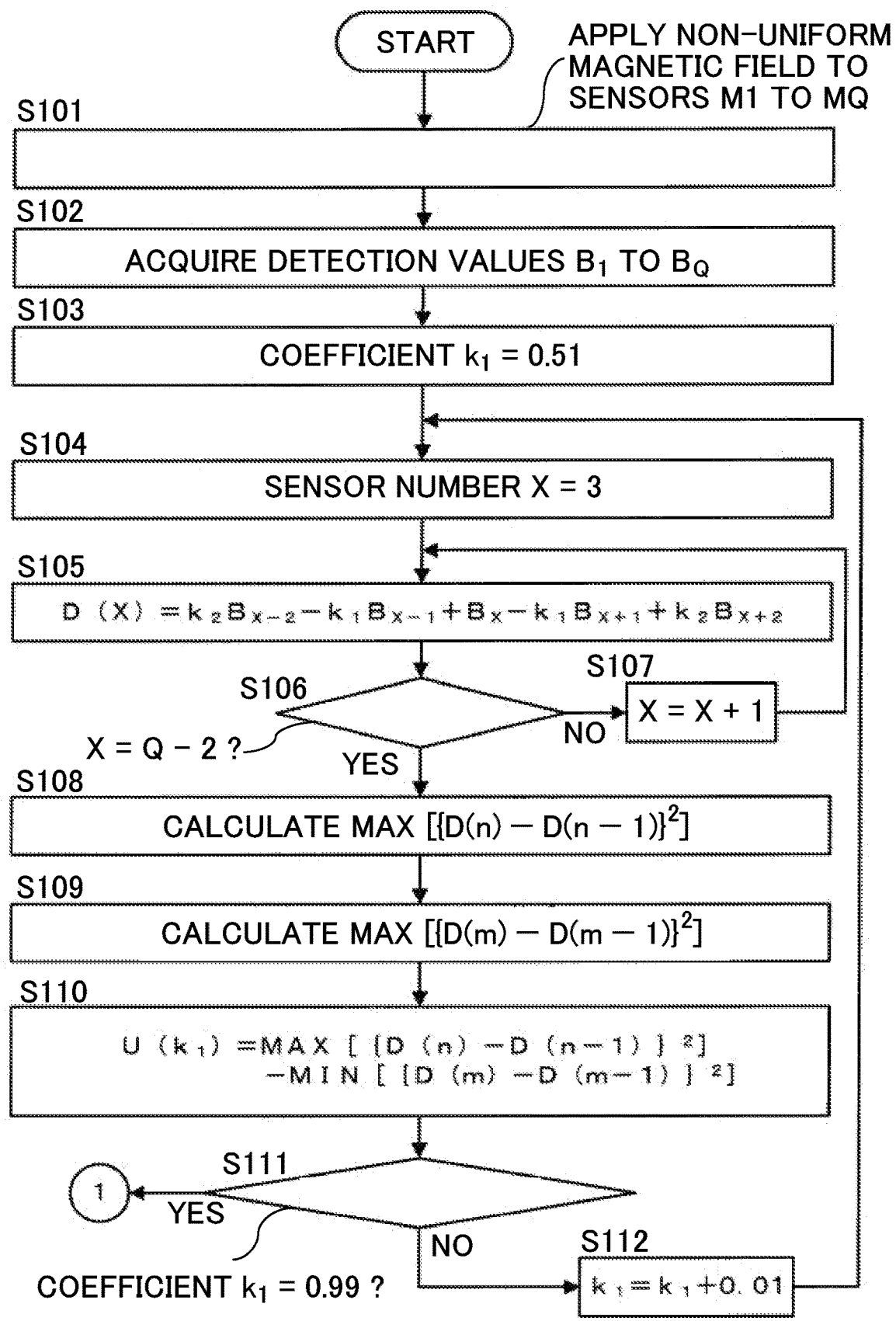
FIG. 7 is a flowchart showing an example of the coefficient calculation method according to one embodiment of the present disclosure.
Figure 8:
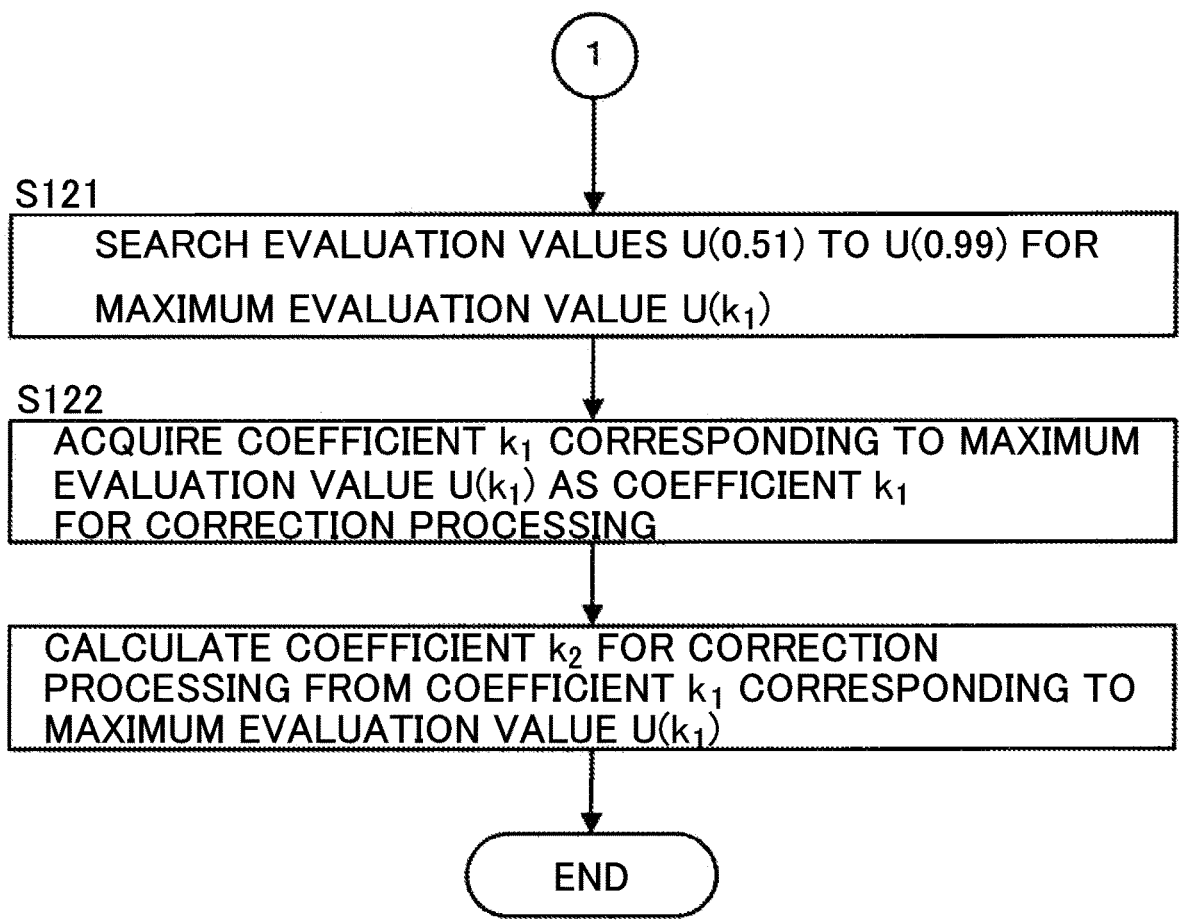
FIG. 8 is a flowchart showing an example of the coefficient calculation method according to one embodiment of the present disclosure.

Next, the coefficient calculation method according to one embodiment of the present disclosure will be described with reference to FIGS. 7 and 8. First, for example, the user arranges a magnet in part of the Q sensors M1 to MQ, for example, near the sensor M5. As a result, a non-uniform magnetic field is applied to the sensors M1 to MQ (step S101). In the example shown in FIG. 1, Q=10. It is preferable that the magnetic field applied to the sensors M1 to MQ is large in change with respect to each position of the sensors M1 to MQ so that the difference between the detection values detected by each sensor M becomes as large as possible. The sensors M1 to MQ correspond to the sensors 1 to Q.

In a state where a non-uniform magnetic field is applied to the sensors M1 to MQ, the coefficient calculation processing unit 53 acquires the detection values $B_1$ to $B_Q$ of the sensors M1 to MQ (step S102: process (a)).

Next, the coefficient calculation processing unit 53 assumes that the coefficient $k_1=0.51$ (step S103). Next, the coefficient calculation processing unit 53 sets the sensor number X to 3 as an initial value (step S104). Next, the coefficient calculation processing unit 53 calculates a value D(X) based on the following Expression (2) and the above Expression (5) (step S105: process (b1)), where the detection value of the sensor MX is $B_X$, the detection value of the sensor M(X+1) adjacent to one side of the sensor MX is $B_{X+1}$, the detection value of the sensor M(X−1) adjacent to the other side of the sensor MX is $B_{X-1}$, the detection value of the sensor M(X+2) adjacent to the sensor M(X+1) in the direction opposite to the sensor MX is $B_{X+2}$, and the detection value of the sensor M(X−2) adjacent to the sensor M(X−1) in the direction opposite to the sensor MX is $B_{X-2}$.

$$D(X) = k_2 B_{X-2} - k_1 B_{X-1} + B_X - k_1 B_X + 1 + k_2 B_{X+2} \tag{2}$$

In step S105, in order to obtain the coefficient $k_2$ from the coefficient $k_1$, Expression (4) may be used instead of Expression (5), or Expression (6) may be used. Alternatively, for example, the coefficient $k_2$ may be obtained from the coefficient $k_1$ using a relational expression other than experimentally obtained Expressions (4) to (6).

Next, the coefficient calculation processing unit 53 compares the sensor number X and Q−2 (step S106). If the sensor number X is not equal to Q−2 (NO in step S106), the coefficient calculation processing unit 53 adds 1 to the sensor number X (step S107), and repeats steps S105 and S106 again.

On the other hand, if the sensor number X is equal to Q−2 (YES in step S106), the calculation of the values D(3) to D(Q−2) is completed, and thus the coefficient calculation processing unit 53 proceeds the process to step S108.

In step S108, the coefficient calculation processing unit 53 searches for the value D(n) and the value D(n−1) at which the square of the difference between the value D(n) and the value D(n−1) of the sensor Mn and the sensor M(n−1) adjacent to each other becomes maximum among the values D(3) to D(Q−2), and calculates the maximum square of the difference between the value D(n) and the value D(n−1) which the square of the difference as MAX[{D(n)−D(n−1)}²] (step S108: process (b2)). n is an integer of 4 to (Q−2).

According to step S108, the sensor Mn and the sensor M(n−1) having the largest difference in the detection value B between the adjacent sensors M are found.

Next, the coefficient calculation processing unit 53 searches for the value D(m) and the value D(m−1) at which the square of the difference between the value D(m) and the value D(m−1) of the sensor Mm and the sensor M(m−1) adjacent to each other becomes minimum among the values D(3) to D(Q−2), and calculates the minimum square of the difference between the value D(m) and the value D(m−1) which the square of the difference as MIN[{D(m)−D(m−1)}$^2$] (step S109: process (b3)). m is an integer of 4 to (Q−2).

According to step S109, the sensor Mm and the sensor M(m−1) having the smallest difference in the detection value B between the adjacent sensors M are found.

Next, the coefficient calculation processing unit 53 calculates the evaluation value U(k$_1$) based on the following Expression (3) (step S110: process (b4)).

$$U(k_1)=\text{MAX}[\{D(n)-D(n-1)\}^2]-\text{MIN}[\{D(m)-D(m-1)\}^2] \quad (3)$$

The evaluation value U(k$_1$) is a difference between MAX [{D(n)−D(n−1)}$^2$], which is the square of the difference between the values obtained by correcting the detection values B by Expression (1), for the sensor Mn and the sensor M(n−1) in which the difference between the detection values B between the adjacent sensors M is the largest at the coefficient k$_1$ set in step S103 or S112, and MIN[{D(m)−D (m−1)}$^2$], which is the square of the difference between the values obtained by correcting the detection values B by Expression (1), for the sensor Mm and the sensor M (m−1) in which the difference between the detection values B between the adjacent sensors M is the smallest.

In other words, for the non-uniform magnetic field applied to the magnetic sensor array 2, at the time of temporary coefficient k$_1$, the evaluation value U(k$_1$) represents the difference between the difference of the correction value in which the difference of the correction value of the detection value B becomes the largest between the adjacent sensors M and the difference of the correction value in which the difference of the correction value of the detection value B becomes the smallest between the adjacent sensors M.

That is, the larger the evaluation value U(k$_1$) is, the larger the difference in the correction value obtained at the time of the coefficient k$_1$ between the portion where the change with respect to the position is large and the portion where the change with respect to the position is small.

The more the coefficient k$_1$ correctly represents the influence of the sensor M on the other adjacent sensors M, the larger the evaluation value U(k$_1$) becomes as a result of the non-uniformity of the magnetic field applied to the magnetic sensor array 2 correctly appearing in the evaluation value U(k$_1$). On the other hand, the more the coefficient k$_1$ deviates from the influence of the sensor M on the other adjacent sensors M, the smaller the evaluation value U(k$_1$) becomes because of the non-uniformity of the magnetic field applied to the magnetic sensor array 2 being diffused.

Therefore, in the processing described in steps S103 to S123, the evaluation value U(k$_1$) is calculated while changing the coefficient k$_1$, and the coefficient k$_1$ when the largest evaluation value U(k$_1$) is obtained is acquired as the coefficient k$_1$ most accurately representing the influence of the sensor M on the other adjacent sensors M, i.e., the correct coefficient k$_1$.

Next, the coefficient calculation processing unit 53 compares the coefficient k$_1$ and 0.99. If the coefficient k$_1$ and 0.99 are not equal (NO in step S111), the coefficient calculation processing unit 53 adds 0.01 to the coefficient k$_1$ and repeats steps S104 to S111 again. On the other hand, if the coefficients k$_1$ and 0.99 are equal (YES in step S111), the calculation of the plurality of evaluation values U(0.51), U(0.52), U(0.53), . . . , U(0.99) has been finished, the process proceeds to step S121.

Note that, in step S112, it is only required that different values can be set for the plurality of coefficients k$_1$, and it is not always necessary to set different values by 0.01. The smaller the value to be added in step S112, i.e., the value to be made different, is made, the more the accuracy of obtaining the coefficient k$_1$ is improved, while the more the arithmetic processing amount is increased. Therefore, the value to be added in step S112 is only required to be appropriately set in consideration of the accuracy and the processing amount.

In step S121, the coefficient calculation processing unit 53 searches the evaluation values U(0.51) to U(0.99) for the maximum evaluation value U(k$_1$) (step S121). Next, the coefficient calculation processing unit 53 acquires the coefficient k$_1$ corresponding to the maximum evaluation value U(k$_1$) as the coefficient k$_1$ for correction processing (step S122). For example, in a case where the evaluation value U(0.77) is the maximum, it can be estimated that 0.77 is the correct coefficient k$_1$, and therefore the coefficient calculation processing unit 53 sets the coefficient k$_1$ for the correction processing to 0.77. This coefficient k$_1$ is used in step S4 described above.

Next, using the same relational expression as used in step S105, for example, Expression (5), the coefficient calculation processing unit 53 calculates the coefficient k$_2$ for correction processing from the coefficient k$_1$ corresponding to the maximum evaluation value U(k$_1$) (step S123). For example, in a case where the coefficient k$_1$=0.77, when the coefficient k$_1$=0.77 is substituted into Expression (5), the coefficient k$_2$=0.27.

As described above, the coefficients k$_1$ and k$_2$ can be calculated by the processing of steps S101 to S123.

Note that the coefficients k$_1$ and k$_2$ are not necessarily limited to the example calculated by the above-described coefficient calculation method. Since the coefficients k$_1$ and k$_2$ are values indicating the influence of other sensors on the target sensor, for example, experimentally, a detection value A in a state where the target sensor alone is not affected by another sensor may be measured, a detection value B of the target sensor and a detection value C of the first sensor in a state where the target sensor and the first sensor alone are not affected by the second sensor may be measured, and detection values D, E, and F detected by the target sensor, the first sensor, and the second sensor may be measured as in the actually used configuration, and the coefficients k$_1$ and k$_2$ may be obtained based on the detection values A to F.

That is, by substituting the detection value D into Expression (1) as the detection value B$_n$, the detection value E into Expression (1) as the detection values B$_{n+1}$ and B$_{n-1}$, and the detection value F into Expression (1) as the detection values B$_{n+2}$ and B$_{n-2}$ the coefficients k$_1$ and k$_2$ may be obtained so as to obtain the correction value C$_n$ substantially equal to the detection value A.

Thus, in order to perform measurement in a state not affected by other sensors, for example, the sensors M1 to M10 shown in FIG. 1 are only required to be configured by amorphous wires separated for each sensor, and the above-described experimental measurement is only required to be performed using the thus separated sensors. In the case of sensors E1 to E10 shown in FIG. 9 to be described later, it is only required to separate a scintillator SC for each sensor, and arrange only necessary sensors to perform the above-described experimental measurement. In the case of the sensors F1 to FQ shown in FIG. 10 to be described later, it is only required to arrange only necessary sensors in the fluid to perform the above-described experimental measurement.

However, the coefficients $k_1$ and $k_2$ are affected by distances between the sensors, characteristic variations of the sensors, and the like. Therefore, due to a change in distance due to assembly accuracy of sensors actually used for measurement and a variation in sensor characteristics, if the coefficients $k_1$ and $k_2$ are obtained by experimental measurement in a state where the sensors are separated as described above, there is a possibility that the accuracy of the coefficients decreases.

On the other hand, according to the above-described coefficient calculation method, since the coefficients $k_1$ and $k_2$ can be calculated in a state where the sensors used for actual measurement are assembled, it is easy to improve the accuracy of the coefficients $k_1$ and $k_2$. Therefore, it is more preferable to calculate the coefficients $k_1$ and $k_2$ using the coefficient calculation method.

Figure 9:
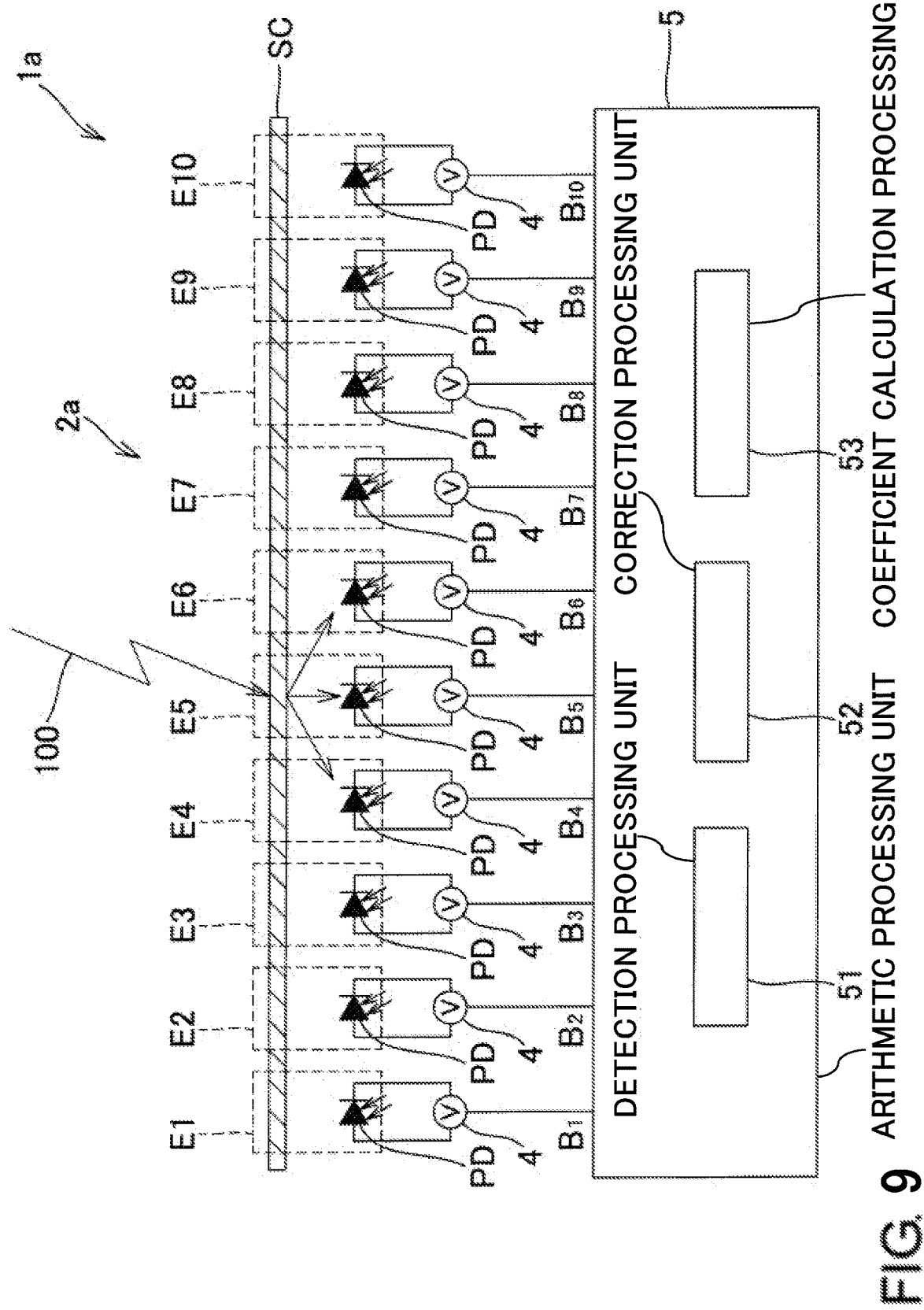
FIG. 9 is an explanatory diagram conceptually showing an example of the configuration of an X-ray measurement device using the detection value correction method according to one embodiment of the present disclosure.

An X-ray measurement device 1a shown in FIG. 9 is different from the magnetic measurement device 1 shown in FIG. 1 in that the sensors E1 to E10 are provided instead of the sensors M1 to M10. Since the X-ray measurement device 1a is configured similarly to the magnetic measurement device 1 in other points, description thereof is omitted, and characteristic points of the X-ray measurement device 1a will be described below.

The X-ray measurement device 1a includes a plurality of photodiodes PD arranged in a line and the scintillator SC, which is a fluorescent plate emitting light by X-rays. The plurality of photodiodes PD are arranged to face the scintillator SC. Each photodiode PD and portions of the scintillator SC facing each photodiode PD constitute the sensors E1 to E10. The sensors E1 to E10 thus arranged in a line constitute an X-ray sensor array 2a.

When the X-ray to be measured hits the scintillator SC, the scintillator SC emits light with a light emission amount corresponding to the X-ray intensity. Light emission of the scintillator SC is detected by a photodiode PD arranged at a position corresponding to the light emission position, and a voltage corresponding to the light emission amount is output from the photodiode PD.

For example, when an X-ray 100 shown in FIG. 9 hits the scintillator SC of the sensor E5 and the scintillator SC emits light, there is possibility that the light is detected not only by the photodiode PD of the sensor E5 but also by the surrounding sensors E4 and E6. That is, the sensors E1 to E10 correspond to an example of a sensor that affects the detection value B of another sensor around the sensors E1 to E10 when detecting X-ray (physical quantity).

Each voltage measurement unit 4 measures the output voltage of each photodiode PD in the sensors E1 to E10, and transmits a signal indicating the measurement result to the arithmetic processing unit 5 as the detection values $B_1$ to $B_{10}$ of the sensors E1 to E10.

The arithmetic processing unit 5 operates similarly to the arithmetic processing unit 5 shown in FIG. 1 based on the detection values $B_1$ to $B_{10}$ of the sensors E1 to E10. Specifically, the arithmetic processing unit 5 executes the similar coefficient calculation method to that described above except irradiating the sensors E1 to E10 with non-uniform X-rays in step S101. In addition, the arithmetic processing unit 5 executes the detection value correction method excluding step S1. This makes it easy to correct the detection values $B_1$ to $B_{10}$ of the sensors E1 to E10.

Figure 10:
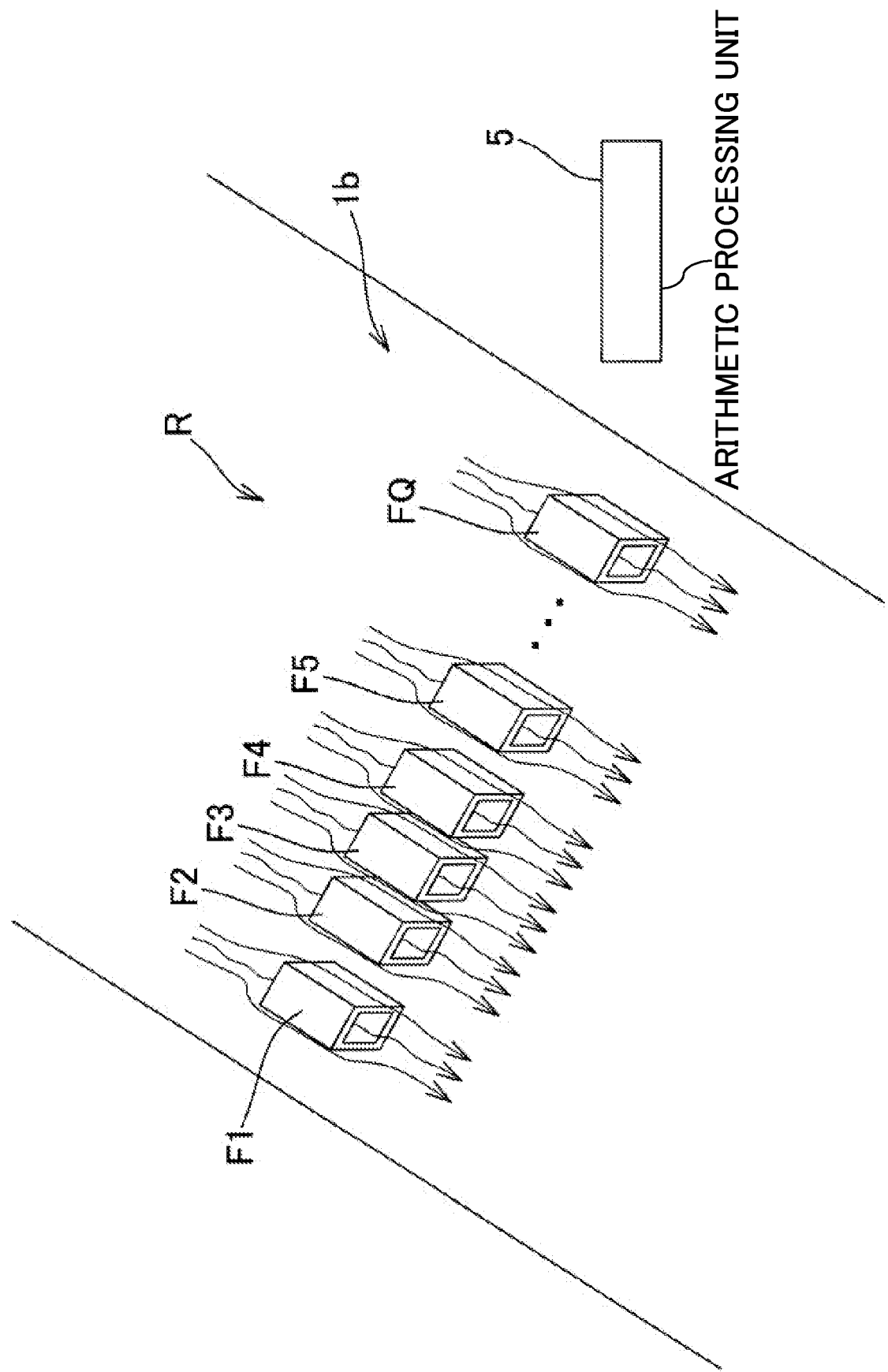
FIG. 10 is an explanatory diagram conceptually showing an example of the configuration of a sensor to which the detection value correction method according to one embodiment of the present disclosure is applicable.

FIG. 10 is an explanatory diagram conceptually showing an example of the configuration of a sensor to which the detection value correction method according to one embodiment of the present disclosure is applicable. The Q sensors F1 to FQ shown in FIG. 10 are flow rate sensors that measure the flow rate or the flow velocity of the fluid. The sensors F1 to FQ may be various flowmeters known as, for example, an electromagnetic flowmeter, a Karman vortex flowmeter, an impeller flowmeter, a floating flowmeter, a thermal flowmeter, a diaphragm flowmeter, an ultrasonic flowmeter, a Coriolis flowmeter, or the like.

In the example shown in FIG. 10, the sensors F1 to FQ are arranged in a line in a river R so that lines extend in a direction intersecting the flowing direction of the water of the river, which is a fluid. Hereinafter, the sensors F1 to FQ are collectively referred to as a sensor F.

The arithmetic processing unit 5 is accommodated in a housing not illustrated, for example, and installed at the riverside of the river R. The sensors F1 to FQ measure the flow rate or the flow velocity at the installation position of each sensor, and transmit the detection values $B_1$ to $B_{10}$ to the arithmetic processing unit 5 using a wired or wireless communication circuit not illustrated.

The arithmetic processing unit 5 operates similarly to the arithmetic processing unit 5 shown in FIG. 1 based on the detection values $B_1$ to $B_Q$ of the sensors F1 to FQ. Specifically, the arithmetic processing unit 5 executes the similar coefficient calculation method to that described above except flowing a non-uniform water amount to the sensors F1 to FQ in step S101. In addition, the arithmetic processing unit 5 executes the detection value correction method excluding step S1. This makes it easy to correct the detection values $B_1$ to $B_Q$ of the sensors F1 to FQ. The sensors F1 to FQ and the arithmetic processing unit 5 constitute a flow rate measurement system 1b, which is an example of the detection value correction system.

When the flow of the river R hits the sensors F1 to FQ, the flow is disturbed as indicated by the arrow in FIG. 10. The disturbance of the flow of the river also affects the flow measured by the adjacent sensor F. That is, the sensors F1 to FQ affect the detection values B of the other sensors F around each sensor F when detecting the flow rate or the flow velocity (physical quantity) of the fluid. The arithmetic processing unit 5 can easily correct such the detection value B of the sensor F.

Although the example in which the detection value of the sensor Mn, which is a target sensor, is corrected based on Expression (1) has been described, the present disclosure is not necessarily limited to the example using Expression (1).

In the correction processing, the detection value of the target sensor is only required to be corrected based on the detection values of the first and second sensors and the first and second coefficients according to the required correction accuracy. For example, the correction may be performed by further adding the detection values of the first and second sensors and parameters other than the first and second coefficients.

The correction processing is only required to be performed based on at least the detection value of the first sensor. According to the required correction accuracy, for example, the correction may be performed based on only the detection value of the first sensor, the correction may be performed based on only the detection value of the first sensor and the first coefficient, the correction may be performed based on only the detection values of the first and second sensors and the first coefficient, or the correction may be performed based on only the detection values of the first and second sensors and the second coefficient.

An example in which two of the first sensors are provided on both sides of the target sensor and two of the second sensors are provided on outer both sides of the target sensor has been described. However, the first and second sensors may be provided one by one on one side of the target sensor. Even if the first and second sensors are configured to be provided one by one on one side of the target sensor, a certain level of correction effect can be obtained.

That is, a detection value correction system according to one example of the present disclosure is a detection value correction system that corrects a detection value of a plurality of sensors that are arranged in a line and detect a physical quantity, and the detection value correction system includes a correction processing unit that executes correction processing of correcting a detection value of a target sensor, which is a sensor to be corrected, among the plurality of sensors, based on at least a detection value of a first sensor adjacent to the target sensor.

A detection value correction method according to one example of the present disclosure is a detection value correction method for correcting a detection value of a plurality of sensors that are arranged in a line and detect a physical quantity, the detection value correction method including: executing correction processing of correcting a detection value of a target sensor, which is a sensor to be corrected, among the plurality of sensors, based on at least a detection value of a first sensor adjacent to the target sensor.

According to this configuration, in a case where the plurality of sensors are arranged in a line, the detection value of the target sensor, which is the sensor to be corrected, is corrected based on the detection value of the first sensor adjacent to the target sensor, and thus it is possible to perform correction so as to reduce the influence of the first sensor on the target sensor. Therefore, it becomes easy to correct the detection value of each sensor arranged in a line.

Preferably, the correction processing further includes correcting the detection value of the target sensor based on the first coefficient representing the influence of the first sensor on the target sensor.

According to this configuration, since the detection value of the target sensor is corrected based on the detection value of the first sensor and the first coefficient representing the influence of the first sensor on the target sensor, it is easy to improve the correction accuracy.

Preferably, the correction processing further includes correcting the detection value of the target sensor based on the detection value of the second sensor adjacent to the first sensor in a direction opposite to the target sensor.

According to this configuration, the detection value of the target sensor can be corrected so as to reduce the influence of the second sensor as well as the first sensor on the target sensor.

Preferably, the correction processing further includes correcting the detection value of the target sensor based on the second coefficient representing the influence of the second sensor on the target sensor, and the second coefficient is smaller than the first coefficient.

According to this configuration, since the detection value of the target sensor is further corrected with the second coefficient representing the influence of the second sensor on the target sensor, it is easy to improve the correction accuracy.

Preferably, the correction processing is processing of calculating the correction value $C_n$ of the detection value of the target sensor based on the following Expression (1), where the detection value of the target sensor is $B_n$, the detection value of the first sensor adjacent to one side of the target sensor is $B_{n+1}$, the detection value of the first sensor adjacent to the other side of the target sensor is $B_{n-1}$, the detection value of the second sensor adjacent, in the opposite direction of the target sensor, to the first sensor adjacent to one side of the target sensor is $B_{n+2}$, the detection value of the second sensor adjacent, in the opposite direction of the target sensor, to the first sensor adjacent to the other side of the target sensor is $B_{n-2}$, the first coefficient is $k_1$, and the second coefficient is $k_2$.

$$C_n = k_2 B_{n-2} - k_1 B_{n-1} + B_n - k_1 B_{n+1} + k_2 B_{n+2} \quad (1)$$

According to this configuration, the detection value of the target sensor can be corrected by the numerical arithmetic operation using Expression (1).

It is preferable to further include a coefficient calculation processing unit that executes (a) a step of acquiring a detection value of each of the plurality of sensors arranged in the line in a state where the physical quantity is applied to the sensors, (b) a step of applying temporary different values to one another to a plurality of the first coefficients $k_1$, and corresponding to each of the first coefficients $k_1$ applied with the temporary value, (b1) calculating a value $D_X$ based on a following Expression (2) for a case where X is 3 to (Q−2), where the plurality of sensors are given serial numbers as sensors 1 to Q, a detection value of a sensor X, which is an arbitrary X-th sensor, of the sensors 1 to Q is $B_X$, a detection value of a sensor (X+1) of an (X+1)-th adjacent to one side of the sensor X, is $B_{X+1}$, a detection value of a sensor (X−1) of an (X−1)-th adjacent to another side of the sensor X, is $B_{X-1}$, a detection value of a sensor (X+2) of an (X+2)-th adjacent to the sensor (X+1) in a direction opposite to the sensor X is $B_{X+2}$, a detection value of a sensor (X−2) of an (X−2)-th adjacent to the sensor (X−1) in a direction opposite to the sensor X is $B_{X-2}$, and the second coefficient is $k_2$, (b2) searching for a value D(n) and a value D(n−1) at which a square of a difference between a value D(n) and a value D(n−1) of a sensor n and a sensor (n−1) adjacent to each other becomes maximum for n that is an integer of 4 to (Q−2) among values D(3) to D(Q−2) calculated in the step (b1), and calculating the maximum square of the difference between the value D(n) and the value D(n−1) as MAX[{D(n)−D(n−1)}²], (b3) searching for a value D(m) and a value D(m−1) at which a square of a difference between a value D(m) and a value D(m−1) of a sensor m and a sensor (m−1) adjacent to each other becomes minimum for m that is an integer of 4 to (Q−2) among values D(3) to D(Q−2) calculated in the step (b1), and calculating the minimum square of the difference between the value D(m) and the value D(m−1) as MIN[{D(m)−D(m−1)}²], and (b4) calculating a plurality of evaluation values $U(k_1)$ corresponding to values of a plurality of the first coefficients $k_1$ based on a following Expression (3), and (c) a step of searching for a maximum evaluation value $U(k_1)$ among the plurality of evaluation values $U(k_1)$, and setting a first coefficient $k_1$ corresponding to the maximum evaluation value $U(k_1)$ and a second coefficient $k_2$ obtained from the first coefficient $k_1$ as the first coefficient and the second coefficient used for the correction processing.

$$D(X) = k_2 B_{X-2} - k_1 B_{X-1} + B_X - k_1 B_{X+1} + k_2 B_{X+2} \quad (2)$$

$$U(k_1) = \text{MAX}[\{D(n) - D(n-1)\}^2] - \text{MIN}[\{(m) - D(m-1)\}^2] \quad (3)$$

According to this configuration, the first coefficient $k_1$ and the second coefficient $k_2$ suitable for the correction processing described above can be calculated.

The second coefficient $k_2$ is preferably obtained based on the following Expression (4).

$$k_2 = k_1^2 \qquad (4)$$

According to this configuration, it is possible to obtain the second coefficient $k_2$ suitable for a case where the influence of a sensor away from the target sensor on the target sensor rapidly decreases as the sensor is away from the target sensor.

The second coefficient $k_2$ may be obtained based on the following Expression (5).

$$k_2 = k_1 - \tfrac{1}{2} \qquad (5)$$

The first coefficient $k_1$ and the second coefficient $k_2$ represent an influence between sensors, and the influence is nothing but energy exchange. According to this configuration, energy is exchanged among the target sensor, the first sensor, and the second sensor with one another, and it is possible to obtain the second coefficient $k_2$ suitable for a case where the energy of the entire sensors is constant.

The second coefficient $k_2$ may be obtained based on the following Expression (6).

$$k_2 = k_1/4 \qquad (6)$$

According to this configuration, it is possible to obtain the second coefficient $k_2$ suitable for a case where the influence decreases in inverse proportion to the square of the distance from the target sensor.

The first coefficient $k_1$ is preferably larger than 0.5 and smaller than 1.

According to this configuration, it is easy to set the first coefficient $k_1$ to an appropriate value.

In addition, each of the sensors may affect a detection value of another sensor around the sensor when detecting the physical quantity.

According to the correction processing described above, it is easy to correct the detection value of such the sensor.

The physical quantity may be a magnetic field, and each of the sensors may be an MI sensor.

According to the correction processing described above, it is easy to correct the detection value of such the MI sensor.

The physical quantity may be an X-ray, and each of the sensors may be an X-ray sensor including a fluorescent plate that emits light by the X-ray and a light sensor that detects light emission of the fluorescent plate.

According to the correction processing described above, it is easy to correct the detection value of such the X-ray sensor.

The physical quantity may be a flow rate or a flow velocity of a fluid, and each of the sensors may be arranged such that the line extends in a direction intersecting a flowing direction of the fluid.

According to the correction processing described above, it is easy to correct the detection value of such the sensor.

It is preferable to further include the plurality of sensors.

According to this configuration, the above-described detection value correction system can detect and correct the above-described physical quantity.

A coefficient calculation method according to one example of the present disclosure is a coefficient calculation method for calculating, for one of a plurality of sensors that are arranged in a line and detect a physical quantity, a first coefficient $k_1$ representing an influence of a first sensor adjacent to the sensor on the sensor and a second coefficient $k_2$ representing an influence of a second sensor adjacent to the first sensor in a direction opposite to the first sensor on the first sensor, the coefficient calculation method including: (a) a step of acquiring a detection value of each of the plurality of sensors arranged in the line in a state where the physical quantity is non-uniformly applied to the sensors; (b) a step of applying temporary different values to one another to a plurality of the first coefficients $k_1$, and corresponding to each of the first coefficients $k_1$ applied with the temporary value, (b1) calculating a value $D_X$ based on a following Expression (2) for a case where X is 3 to (Q−2), where the plurality of sensors are given serial numbers as sensors 1 to Q, a detection value of a sensor X, which is an arbitrary X-th sensor, of the sensors 1 to Q is $B_X$, a detection value of a sensor (X+1) of an (X+1)-th adjacent to one side of the sensor X, is $B_{X+1}$, a detection value of a sensor (X−1) of an (X−1)-th adjacent to another side of the sensor X, is $B_{X-1}$, a detection value of a sensor (X+2) of an (X+2)-th adjacent to the sensor (X+1) in a direction opposite to the sensor X is $B_{X+2}$, a detection value of a sensor (X−2) of an (X−2)-th adjacent to the sensor (X−1) in a direction opposite to the sensor X is $B_{X-2}$, and the second coefficient is $k_2$, (b2) searching for a value D(n) and a value D(n−1) at which a square of a difference between a value D(n) and a value D(n−1) of a sensor n and a sensor (n−1) adjacent to each other becomes maximum for n that is an integer of 4 to (Q−2) among values D(3) to D(Q−2) calculated in the step (b1), and calculating the maximum square of the difference between the value D(n) and the value D(n−1) as $\mathrm{MAX}[\{D(n)-D(n-1)-1\}^2]$, (b3) searching for a value D(m) and a value D(m−1) at which a square of a difference between a value D(m) and a value D(m−1) of a sensor m and a sensor (m−1) adjacent to each other becomes minimum for m that is an integer of 4 to (Q−2) among values D(3) to D(Q−2) calculated in the step (b1), and calculating the minimum square of the difference between the value D(m) and the value D(m−1) as $\mathrm{MIN}[\{D(m)-D(m-1)\}^2]$, and (b4) calculating a plurality of evaluation values $U(k_1)$ corresponding to values of a plurality of the coefficients $k_1$ based on a following expression (3); and (c) a step of searching for a maximum evaluation value $U(k_1)$ among the plurality of evaluation values $U(k_1)$, and setting a first coefficient $k_1$ corresponding to the maximum evaluation value $U(k_1)$ and a second coefficient $k_2$ obtained from the first coefficient $k_1$ as the first coefficient and the second coefficient used for the correction processing.

$$D(X) = k_2 B_{X-2} - k_1 B_{X-1} + B_X - k_1 B_{X+1} + k_2 B_{X+2} \qquad (2)$$

$$U(k_1) = \mathrm{MAX}[\{D(n)-D(n-1)\}^2] - \mathrm{MIN}[\{D(m)-D(m-1)\}^2] \qquad (3)$$

According to this configuration, the first coefficient $k_1$ and the second coefficient $k_2$ suitable for the correction processing described above can be calculated.

In the detection value correction method described above, further based on a detection value of a second sensor adjacent to the first sensor in a direction opposite to the target sensor and a second coefficient representing an influence of the second sensor on the target sensor, the correction processing preferably includes calculating the correction value $C_n$ of the detection value of the target sensor based on the following Expression (1), where the detection value of the target sensor is $B_n$, the detection value of the first sensor adjacent to one side of the target sensor is $B_{n+1}$, the detection value of the first sensor adjacent to the other side of the target sensor is $B_{n-1}$, the detection value of the second sensor adjacent, in the opposite direction of the target sensor, to the first sensor adjacent to one side of the target sensor is $B_{n+2}$, the detection value of the second sensor adjacent, in the opposite direction of the target sensor, to the first sensor adjacent to the other side of the target sensor is $B_{n-2}$, the first coefficient is $k_1$, and the second coefficient is $k_2$.

$$C_n = k_2 B_{n-2} - k_1 B_{n-1} + B_n - k_1 B_{n+1} + k_2 B_{n+2} \quad (1)$$

According to this configuration, the detection value of the target sensor can be corrected by the numerical arithmetic operation using Expression (1).

Such the detection value correction system and the detection value correction method can easily correct a detection value of each sensor even when a plurality of sensors are arranged in a line. In addition, such the coefficient calculation method can calculate a coefficient suitable for correction processing in the detection value correction system and the detection value correction method.

This application is based on Japanese Patent Application No. 2019-045780 filed on Mar. 13, 2019, the content of which is included in the present application. Note that specific embodiments or examples made in the section of DESCRIPTION OF EMBODIMENT merely clarify the technical content of the present disclosure, and the present disclosure should not be interpreted in a narrow sense by being limited only to such specific examples.

Features of the above-described preferred embodiments and the modifications thereof may be combined appropriately as long as no conflict arises.

While preferred embodiments of the present disclosure have been described above, it is to be understood that variations and modifications will be apparent to those skilled in the art without departing from the scope and spirit of the present disclosure. The scope of the disclosed embodiments is thus indicated by the appended claims and all changes which come within the meaning and range of equivalency of the claims are therefore intended to be embraced.

What is claimed is:

1. A sensor measurement device comprising:
   a sensor array comprising a plurality of electromagnetic sensors arranged in a line, each electromagnetic sensor configured to detect a physical quantity and produce a detection value, wherein the physical quantity is one of a magnetic field or an X-ray;
   a detection value correction system that corrects a detection value of the plurality of electromagnetic sensors, the detection value correction system comprising:
   a correction processing unit that executes correction processing of correcting a detection value of a target sensor, which is a sensor to be corrected, among the plurality of electromagnetic sensors, based on at least a detection value of a first sensor adjacent to the target sensor,
   wherein the correction processing further corrects a detection value of the target sensor based on a first coefficient representing an influence of the first sensor on the target sensor,
   wherein the correction processing further corrects a detection value of the target sensor based on a detection value of a second sensor adjacent to the first sensor in a direction opposite to the target sensor, and
   wherein the correction processing further corrects a detection value of the target sensor based on a second coefficient representing an influence of the second sensor on the target sensor, and
   the second coefficient is smaller than the first coefficient.

2. The sensor measurement device according to claim 1, wherein the correction processing is processing of calculating a correction value $C_n$ of a detection value of the target sensor based on a following Expression (1), where a detection value of the target sensor is $B_n$, a detection value of a first sensor adjacent to one side of the target sensor is $B_{n+1}$, a detection value of a first sensor adjacent to another side of the target sensor is $B_{n-1}$, a detection value of a second sensor adjacent, in an opposite direction of the target sensor, to a first sensor adjacent to one side of the target sensor is $B_{n+2}$, a detection value of a second sensor adjacent, in an opposite direction of the target sensor, to a first sensor adjacent to another side of the target sensor is $B_{n-2}$, the first coefficient is $k_1$, and the second coefficient is $k_2$.

$$C_n = k_2 B_{n-2} - k_1 B_{n-1} + B_n - k_1 B_{n+1} + k_2 B_{n+2} \quad (1)$$

3. The sensor measurement device according to claim 2, further comprising a coefficient calculation processing unit that executes
   (a) a step of acquiring a detection value of each of the plurality of electromagnetic sensors arranged in the line in a state where the physical quantity is applied to the sensors,
   (b) a step of applying temporary different values to one another to a plurality of the first coefficients $k_1$, and corresponding to each of the first coefficients $k_1$ applied with the temporary value,
   (b1) calculating a value $D_X$ based on a following Expression (2) for a case where X is 3 to (Q−2), where the plurality of electromagnetic sensors are given serial numbers as sensors 1 to Q, a detection value of a sensor X, which is an arbitrary X-th sensor, of the sensors 1 to Q is $B_X$, a detection value of a sensor (X+1) of an (X+1)-th adjacent to one side of the sensor X, is $B_{X+1}$, a detection value of a sensor (X−1) of an (X−1)-th adjacent to another side of the sensor X, is $B_{X-1}$, a detection value of a sensor (X+2) of an (X+2)-th adjacent to the sensor (X+1) in a direction opposite to the sensor X is $B_{X+2}$, a detection value of a sensor (X−2) of an (X−2)-th adjacent to the sensor (X−1) in a direction opposite to the sensor X is $B_{-2}$, and the second coefficient is $k_2$,
   (b2) searching for a value D(n) and a value D(n−1) at which a square of a difference between a value D(n) and a value D(n−1) of a sensor n and a sensor(n−1) adjacent to each other becomes maximum for n that is an integer of 4 to (Q−2) among values D(3) to D(Q−2) calculated in the step (b1), and calculating the maximum square of the difference between the value D(n) and the value D(n−1) as MAX $[\{D(n)-D(n-1)-1\}^2]$,
   (b3) searching for a value D(m) and a value D(m−1) at which a square of a difference between a value D(m) and a value D(m−1) of a sensor m and a sensor (m−1) adjacent to each other becomes minimum form that is an integer of 4 to (Q−2) among values D(3) to D(Q−2) calculated in the step (b1), and calculating the minimum square of the difference between the value D(m) and the value D(m−1) as MIN $[\{D(m)-D(m-1)\}^2]$, and
   (b4) calculating a plurality of evaluation values $U(k_1)$ corresponding to values of a plurality of the first coefficients $k_1$ based on a following Expression (3), and
   (c) a step of searching for a maximum evaluation value $U(k_1)$ among the plurality of evaluation values $U(k_1)$, and setting a first coefficient $k_1$ corresponding to the maximum evaluation value $U(k_1)$ and a second coefficient $k_2$ obtained from the first coefficient $k_1$ as the first coefficient and the second coefficient used for the correction processing.

$$D(X)=k_2 B_{X-2}-k_1 B_{X-1}+B_X-k_1 B_{X+1}+k_2 B_{X+2} \quad (2)$$

$$U(k_1)=\text{MAX}[\{D(n)-D(n-1)\}^2]-\text{MIN}[\{D(m)-D(m-1)\}^2] \quad (3)$$

4. The sensor measurement device according to claim 2, wherein the second coefficient $k_2$ is obtained based on a following Expression (4).

$$k_2=k_1^2 \quad (4)$$

5. The sensor measurement device according to claim 2, wherein the second coefficient $k_2$ is obtained based on a following Expression (5).

$$k_2=k_1-\tfrac{1}{2} \quad (5)$$

6. The sensor measurement device according to claim 2, wherein the second coefficient $k_2$ is obtained based on a following Expression (6).

$$k_2=k_1/4 \quad (6)$$

7. The sensor measurement device according to claim 2, wherein the first coefficient $k_1$ is larger than 0.5 and smaller than 1.

8. The sensor measurement device according to claim 1, wherein each of the plurality of electromagnetic sensors affects a detection value of another sensor around the sensor when detecting the physical quantity.

9. The sensor measurement device according to claim 1, wherein
the physical quantity is a magnetic field, and
each of the plurality of electromagnetic sensors is an magneto impedance (MI) sensor.

10. The sensor measurement device according to claim 1, wherein
the physical quantity is an X-ray, and
each of the plurality of electromagnetic sensors is an X-ray sensor including a fluorescent plate that emits light by the X-ray and a light sensor that detects light emission of the fluorescent plate.

11. A detection value correction method for correcting a detection value of a plurality of electromagnetic sensors, the detection value correction method comprising:
executing correction processing of correcting a detection value of a target sensor, which is a sensor to be corrected, among the plurality of electromagnetic sensors that are arranged in a line and detect a physical quantity, based on at least a detection value of a first sensor adjacent to the target sensor, wherein the physical quantity is one of a magnetic field or an X-ray,
executing the correction processing comprises further correcting a detection value of the target sensor based on a first coefficient representing an influence of the first sensor on the target sensor, based on a detection value of a second sensor adjacent to the first sensor in a direction opposite to the target sensor, and based on a second coefficient representing an influence of the second sensor on the target sensor,
the second coefficient is smaller than the first coefficient.

12. The detection value correction method according to claim 11, wherein
the correction processing is processing of calculating a correction value G of a detection value of the target sensor based on a following Expression (1), where a detection value of the target sensor is $B_n$, a detection value of a first sensor adjacent to one side of the target sensor is $B_{n+1}$, a detection value of a first sensor adjacent to another side of the target sensor is $B_{n-1}$, a detection value of a second sensor adjacent, in an opposite direction of the target sensor, to a first sensor adjacent to one side of the target sensor is $B_{n+2}$, a detection value of a second sensor adjacent, in an opposite direction of the target sensor, to a first sensor adjacent to another side of the target sensor is $B_{n-2}$, the first coefficient is $k_1$, and the second coefficient is $k_2$.

$$C_n=k_2 B_{n-2}-k_1 B_{n-1}+B_n-k_1 B_{n+1}+k_2 B_{n+2} \quad (1)$$

13. The method of claim 11, wherein
the physical quantity is a magnetic field, and
each of the plurality of electromagnetic sensors is a magneto impedance (MI) sensor.

14. The method of claim 11, wherein
wherein
the physical quantity is an X-ray, and
each of the plurality of electromagnetic sensors is an X-ray sensor including a fluorescent plate that emits light by the X-ray and a light sensor that detects light emission of the fluorescent plate.

* * * * *